(12) United States Patent
Zhao et al.

(10) Patent No.: US 10,514,422 B2
(45) Date of Patent: Dec. 24, 2019

(54) ASPECTS FOR DETERMINING CHARGING CAPACITY OF A BATTERY (71) Applicant: LENOVO (BEIJING) LIMITED, Beijing (CN)

(72) Inventors: Shuangcheng Zhao, Beijing (CN); Weizhi Lin, Beijing (CN)

(73) Assignee: LENOVO (BEIJING) LIMITED, Beining (CN)

( * ) Notice: Subject to any disclaimer, the term of this patent is extended or adjusted under 35 U.S.C. 154(b) by 545 days.

(21) Appl. No.: 15/085,085

(22) Filed: Mar. 30, 2016

(65) Prior Publication Data

US 2017/0168117 A1    Jun. 15, 2017

(30) Foreign Application Priority Data

Dec. 11, 2015   (CN) .......................... 2015 1 0920916

(51) Int. Cl.
*G01R 31/36*   (2019.01)
(52) U.S. Cl.
CPC ................................ *G01R 31/3648* (2013.01)
(58) Field of Classification Search
None
See application file for complete search history.

(56) References Cited

U.S. PATENT DOCUMENTS

| 8,427,109 B2* | 4/2013 | Melichar | B60L 11/1861 320/132 |
| 2005/0046389 A1* | 3/2005 | Kim | G01R 31/3648 320/132 |

FOREIGN PATENT DOCUMENTS

| CN | 103513187 A | 1/2014 |
| CN | 104931892 A | 9/2015 |

OTHER PUBLICATIONS

Chinese Patent Office, 1st Office Action dated Sep. 5, 2017 re Application of Lenovo (Beijing) Co., Ltd., No. 201510920916.3, filed Dec. 11, 2015 (English summary of Office action).

* cited by examiner

*Primary Examiner* — Alexander G Ghyka (74) *Attorney, Agent, or Firm* — Patrick J. Daugherty; Daugherty & Del Zoppo Co., LPA (57) ABSTRACT

Aspects acquire at least one first battery state when a battery of the electronic device is in a first dormant state; acquire at least one second battery state of the battery in a second dormant state and the charge level or discharge capacity of the battery during the first dormant state and the second dormant state when it is confirmed that the battery enters the non-dormant state from the first dormant state, and enters the second dormant state from the non-dormant state; and calculate the actual full charge level of the battery on the basis of at least the first battery state, at least the second battery state and the charge level or discharge capacity. The technical problem that the calibration of battery capacity can only be conducted in a full charged state for the battery existing in the electronic device in prior art is solved by the above-mentioned technical solution provided in the present invention.

20 Claims, 2 Drawing Sheets

Acquiring the change rate of the full charge level on the basis of the historical full charge level, the current calculated full charge level, the first cell temperature and the second cell temperature, wherein, the change rate refers to the ratio of the difference between the historical full charge level and the current calculated full charge level to the difference between the first cell temperature and the second cell temperature; — S301

In case the change rate is greater than a preset value, the historical full charge level is then adopted as the actual full charge level; — S302

In case the change rate is less than the preset value, the current calculated full charge level is then adopted as the actual full charge level. — 303

ASPECTS FOR DETERMINING CHARGING CAPACITY OF A BATTERY

FIELD OF THE INVENTION

The present invention relates to the field of electronic technology, more particularly, to an information processing method and an electronic device.

BACKGROUND

With the continuous development of the science and technology, the use of various types of electronic devices, such as mobile phones, tablet computers and notebook computers has become more and more popular.

The battery makes up a crucial part of the electronic device, however, with the effects of various factors such as temperature, discharge rate or battery aging during the use of the electronic device, the battery capacity decreases gradually, thereby causing a lower accuracy of the battery capacity reported by the system.

In prior art, in the case of calibrating the battery capacity, the battery should be fully charged firstly and then discharged from 100% to 1% while recording the real electricity quantity discharged to amend the reported capacity, therefore, the calibration method requires the battery to become fully charged firstly and then discharged, which is somewhat stringent.

During the process of realizing the technical solution in the embodiment of the present application, the inventor of the present application discovered the following technical problem at least in prior art:

The technical problem that the calibration of battery capacity can only be conducted in a fully charged state for the battery exists in the electronic device in prior art.

SUMMARY

To realize the calibration of battery capacity for the battery in a non-fully charged state of the electronic device and to solve the technical problem, embodiments of the present invention provides information processing methods, electronic devices and computer program products.

According to one aspect of the present invention, a computer-implemented information processing method, comprising executing on a processor steps that include:

determining at least one first battery state of a battery of an electronic device while the battery is in a first dormant state wherein a charging current level and a discharging current level of the battery are zero;

in response to the battery entering a non-dormant state from the first dormant state, and to the battery entering a second dormant state from the non-dormant state wherein the charging current level and the discharging current level of the battery are zero, determining at least one second battery state of the battery while the battery is in the second dormant state, and at least one of a charge level or discharge capacity of the battery during the first dormant state and the second dormant state; and determining an actual full charge level of the battery as a function of the at least one first battery state, the at least one second battery state and the determined at least one of the charge level and the discharge capacity of the battery during the first dormant state and the second dormant state.

According to another aspect of the present invention, an electronic device, comprises a housing, a battery disposed in the housing, and a processing unit disposed in the housing and connected with the battery. The processing unit determines at least one first battery state of the battery while the battery is in a first dormant state wherein a charging current level and a discharging current level of the battery are zero. In response to the battery entering a non-dormant state from the first dormant state, and to the battery entering a second dormant state from the non-dormant state wherein the charging current level and the discharging current level of the battery are zero, the processing unit determines at least one second battery state of the battery while the battery is in the second dormant state, and at least one of a charge level or discharge capacity of the battery during the first dormant state and the second dormant state. The processing unit also determines an actual full charge level of the battery as a function of the at least one first battery state, the at least one second battery state and the determined at least one of the charge level and the discharge capacity of the battery during the first dormant state and the second dormant state.

According to another aspect of the present invention, a computer program product, comprehends a non-transitory computer storage media that includes program code instructions thereon for execution by a processing unit that is in communication with a battery. The program code instructions cause the processing unit to:

determine at least one first battery state of the battery while the battery is in a first dormant state wherein a charging current level and a discharging current level of the battery are zero;

in response to the battery entering a non-dormant state from the first dormant state, and to the battery entering a second dormant state from the non-dormant state wherein the charging current level and the discharging current level of the battery are zero, determine at least one second battery state of the battery while the battery is in the second dormant state, and at least one of a charge level or discharge capacity of the battery during the first dormant state and the second dormant state; and determine an actual full charge level of the battery as a function of the at least one first battery state, the at least one second battery state and the determined at least one of the charge level and the discharge capacity of the battery during the first dormant state and the second dormant state.

DETAILED DESCRIPTION OF ASPECTS OF THE INVENTION

An information processing method and an electronic device according to the embodiment of the present application, used for solving the technical problem that the calibration of battery capacity can only be conducted in a full charged state for the battery existing in the electronic device in prior art, thus achieving the technical effect of realizing the calibration of battery capacity in the battery in a non-fully charged state.

For solving the technical problem mentioned above, the technical solution in the embodiment of the present application proposes the following general idea:

acquiring at least one first battery state message when the battery of the electronic device is in the first dormant state;

acquiring at least one second battery state message of the battery in a second dormant state and the charge level or discharge capacity of the battery during the first dormant state and the second dormant state when it is confirmed that the battery enters the non-dormant state from the first dormant state, and enters the second dormant state from the non-dormant state, wherein, when the battery is in the first dormant state and the second dormant state, both the charging current and discharging current of the battery are zero;

The actual full charge level of the battery can be calculated on the basis of the at least one first battery state message, the at least one second battery state message at least and the charge level or discharge capacity.

In the technical solution mentioned above, acquiring the at least one first battery state message when the battery of the electronic device is in the first dormant state; acquiring at least one second battery state message of the battery in a second dormant state and the charge level or discharge capacity of the battery during the first dormant state and the second dormant state when it is confirmed that the battery enters the non-dormant state from the first dormant state, and enters the second dormant state from the non-dormant state, wherein, when the battery is in the first dormant state and the second dormant state, both the charging current and discharging current of the battery are zero; and the actual full charge level of the battery can be calculated based on the at least one first battery state message, the at least one second battery state message and the charge level or discharge capacity. So unlike in prior art, in which, in the case of calibrating the battery capacity, the battery should be fully charged firstly and then discharged from 100% to 1% while recording the real electricity quantity discharged to amend the reported capacity, in this technical solution, the actual full charge level of the battery can be obtained by calculating on the basis of the state messages obtained between the two dormant states of the battery of the electronic device and the charge level or discharge capacity between the two dormant states, without getting the battery fully charged in advance, thereby solving the technical problem that the calibration of battery capacity can only be conducted in a fully charged state for the battery existing in the electronic device in prior art, achieving the technical effect of realizing the calibration of battery capacity even in the battery in a non-fully charged state.

In order to better understand the technical solution mentioned above, the technical solution of the present invention will be described below in detail with the drawings and specific embodiments, it is to be understood that the embodiments of the present application and the specific characteristics in the embodiments are for the detailed description on the technical solution of the present invention and should not be regarded as limiting, the embodiments of the present application and the technical characteristics in the embodiments can be combined mutually in the case that there are no conflicts.

Embodiment 1

An information processing method according to Embodiment 1 of the present application, which can be applied to an electronic device, the electronic device may be a smartphone, a tablet computer, a notebook computer or other electronic device; no specific limits are given on this in the embodiment of the present application.

Figure 1:
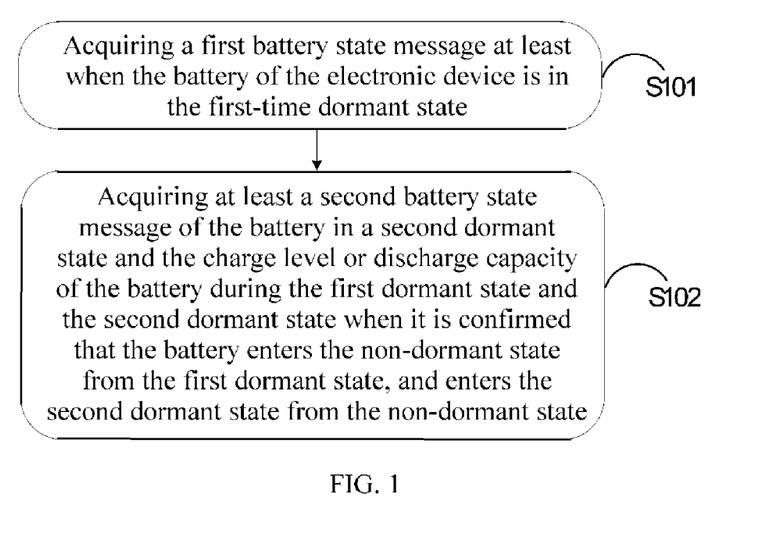
FIG. 1 is a flow-chart for specific implementation of an information processing method according to embodiment 1 of the present application.

Please refer to FIG. 1, wherein the present application provides an information processing method, comprising:

S101: acquiring at least one first battery state message when the battery of the electronic device is in the first dormant state;

S102: acquiring at least one second battery state message of the battery in a second dormant state and the charge level or discharge capacity of the battery during the first dormant state and the second dormant state when it is confirmed that the battery enters the non-dormant state from the first dormant state, and enters the second dormant state from the non-dormant state, wherein, when the battery is in the first dormant state and the second dormant state, both the charging current and discharging current of the battery are zero; the actual full charge level of the battery can be calculated based on the at least one first battery state message, the at least one second battery state message and the charge level or discharge capacity.

In the embodiment of the present application, step S101 is executed firstly: acquiring at least one first battery state message when the battery of the electronic device is in the first dormant state.

In the embodiment of the present application, the specific implementation of step S101 comprises:

acquiring the first current remaining power when the battery of the electronic device is in the first dormant state and acquiring the first cell temperature of the cell for the battery;

Accordingly, the specific implementation of step S102 comprises:

acquiring the second current remaining power when the battery is in the second dormant state and acquiring the second cell temperature of the cell.

During the specific implementation, the historical power consumption data of the battery is also required to be obtained, as the historical power consumption data in the embodiment of the present application is stored in the BMU (Battery Management Unit) of the electronic device, and the BMU is set on the printed circuit board within the battery, powered by the cell of the battery directly and always in the operating state even the electronic device is in the off mode, therefore, the step of acquiring the historical power consumption data of the battery can be done before step S101, after step S101 or during the executing of the step S101, all three implementation models mentioned above are applicable and can be selected by those of ordinary skill in the art according to actual requirements; no specific limits are given on this in the embodiment of the present application.

In the embodiment of the present application, the historical full charge level of the battery is taken as a specific example of the historical power consumption data, such as: 38 wh or 40 wh, in the embodiment of the present application, the historical full charge level of the battery is specifically the updated full charge level calculated last time or the initial full charge level of the battery for its first use, such as: a full charge-discharge study conducted on the battery of the electronic device before it leaves the factory, calculating the initial full charge level of the battery, both conditions mentioned above are applicable, the historical full charge level is determined as the updated full charge level calculated last time or the initial full charge level according to the actual conditions, no specific limits are given on this in the embodiment of the present application.

During the specific implementation, in addition to the step of acquiring the historical full charge level of the battery, it is also required to obtain the first current remaining power when the battery is in the first dormant state and the first cell temperature of the cell of battery, particularly, such as: the obtained first current remaining power is 30 wh, 80% of the historical full charge level and the first cell temperature of the cell is 20 degree.

Accordingly, in the embodiment of the present application, it is also required to obtain at least one second battery state message when the electronic device is in the second dormant state, while during the specific implementation, before acquiring at least one second battery state message when the electronic device is in the second dormant state, the method also comprises:

acquiring the current remaining power of the battery;

In the case that the difference between current remaining power and the first remaining power lies within the preset range, execute the step of: acquiring the second current remaining power when the battery is in the second dormant state and acquiring the second cell temperature of the cell.

During the specific implementation, to ensure the calibration accuracy of the battery capacity, the variation of the percentage of remaining power of the battery between two dormant states should be ensured within the preset range, in the embodiment of the present application the preset range is 30% to 50% specifically, the reason for limiting the preset range as 30% to 50% is that, in the case that the variation of the percentage of remaining power of the battery is lower than 30%, such as 2%, the battery capacity needs to be calibrated just a moment after using of the electronic device, the calibration frequency increases which brings inconvenience for the use of user; In the case that the variation of the percentage of remaining power of the battery is higher than 50%, such as 80%, the calibration of battery capacity will be conducted only when a big variation of the percentage of remaining power occurs, thereby, the time of automatic calibration of battery capacity reduces and affects the calibration accuracy of the battery capacity.

During the specific implementation, the preset range is 11 wh to 30 wh, the obtained current remaining power is 11 wh, 30% of the historical full charge level, the first current remaining power is 30 wh, the difference between the current remaining power and the first current remaining power is 19 wh, which lies within the preset range 11 wh to 30 wh, thereby acquiring at least one second battery state message of the battery in the second dormant state.

In the embodiment of the present application, the at least one specific second battery state message is: the second current remaining power, the second cell temperature of the cell and the charge level or discharge capacity between the first dormant state and the second dormant state, particularly, such as: the second current remaining power is 11 wh, the second cell temperature is 25 degrees and the discharge capacity is 20 wh.

Figure 2:
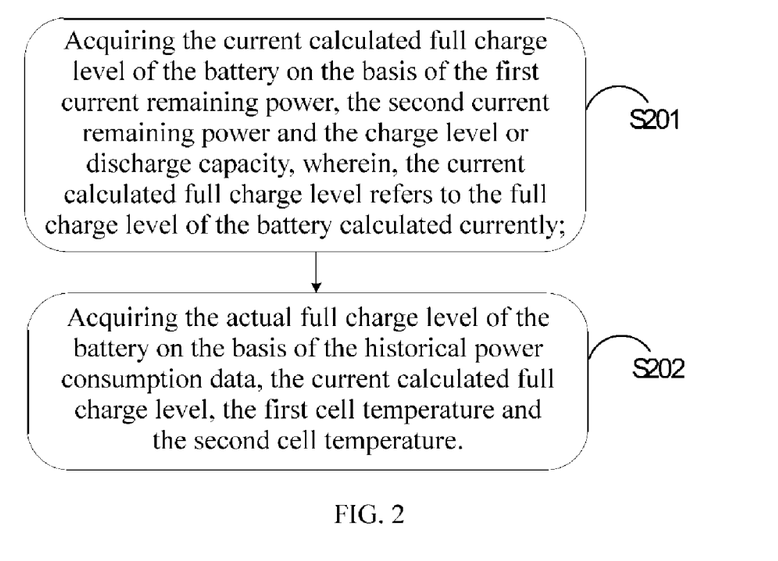
FIG. 2 is a flow-chart for specific implementation of the step that also comprised an information processing method after step S102 according to embodiment 1 of the present application.

In the embodiment of the present application, when the battery is in the first dormant state and the second dormant state, both the charging current and discharging current of the battery are zero;

In the embodiment of the present application, once step S102 is executed, please refer to FIG. 2, the method also comprising:

S201: acquiring the currently calculated full charge level of the battery on the basis of the first current remaining power, the second current remaining power and the charge level or discharge capacity, wherein, the currently calculated full charge level is the full charge level of the battery calculated currently.

S202: acquiring the actual full charge level of the battery on the basis of the historical power consumption data, the currently calculated full charge level, the first cell temperature and the second cell temperature.

During the specific implementation, step S201 is executed firstly: acquiring the currently calculated full charge level of the battery on the basis of the first current remaining power, the second current remaining power and the charge level or discharge capacity, wherein, the currently calculated full charge level is the full charge level of the battery calculated currently.

In the embodiment of the present application, once obtained, the first current remaining power, the second current remaining power and the charge level or discharge capacity between the first dormant state and the second dormant state calculate the currently calculated full charge level of the battery on the basis of the calculation formula FCC1=PC/(RSOC1−RSOC2), wherein, FCC1 is the currently calculated full charge level of the battery, PC is the charge level or discharge capacity, RSOC1 and RSOC2 refer to the first remaining power percentage and the second remaining power percentage of the battery calculated on the basis of the first current remaining power and the second current remaining power.

During the specific implementation, in the case that PC=20 wh, RSOC1=80%, and RSOC2=30%, putting them into the calculation formula mentioned above, through calculating, the currently calculated full charge level of the battery is 40 wh.

In the embodiment of the present application, once step S201 is executed, step S202 should be executed subsequently: acquiring the actual full charge level of the battery on the basis of the historical power consumption data, the currently calculated full charge level, the first cell temperature and the second cell temperature.

Figure 3:
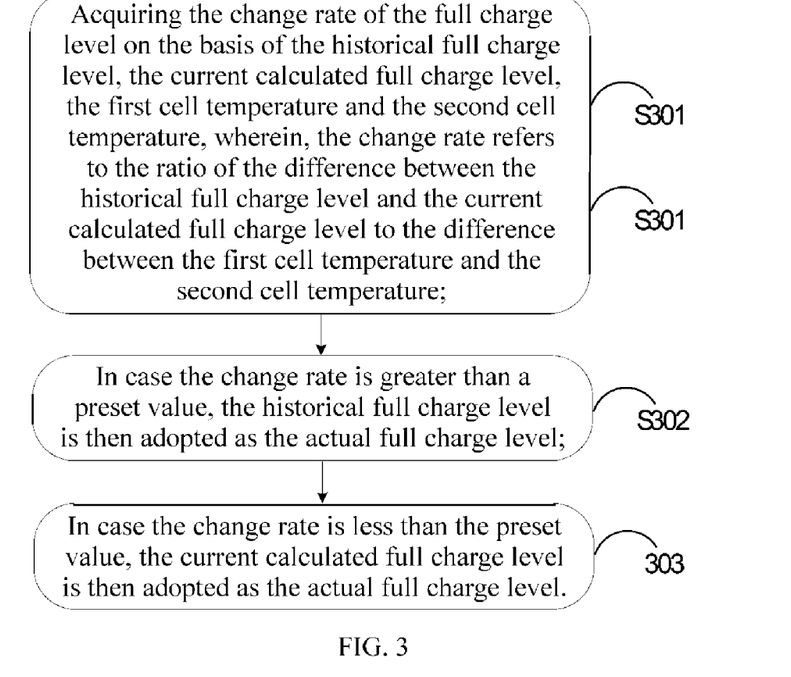
FIG. 3 is a flow-chart for specific implementation of the step S201 that also comprised an information processing method after step S102 according to embodiment 1 of the present application.

During the specific implementation, for the specific implementation of step S201, please refer to FIG. 3, which comprises the following steps specifically:

S301: acquiring the change rate of the full charge level on the basis of the historical full charge level, the currently calculated full charge level, the first cell temperature and the second cell temperature, wherein the change rate is the ratio of the difference between the historical full charge level and the currently calculated full charge level to the difference between the first cell temperature and the second cell temperature;

S302: In the case that the change rate is greater than one preset value, the historical full charge level is then adopted as the actual full charge level;

S303: In the case that the change rate is smaller than the preset value, the currently calculated full charge level is then adopted as the actual full charge level.

In the embodiment of the present application, the historical full charge level is taken as the example of the historical power consumption data.

During the specific implementation, once obtained the currently calculated full charge level of the battery through calculating, due to the cumulative error during the calculating, the obtained current calculated full charge level may not be the actual full charge level of the battery, therefore, it is also required to calculate the change rate of the full charge level on the basis of the obtained current calculated full charge level, the historical full charge level, the first cell temperature and the second cell temperature and with the corresponding formula (FCC1−FCC0)/(T1−T0), wherein, FCC0 is the historical full charge level, T0 is the first cell temperature and T1 is the second cell temperature.

Once obtained the change rate through calculating, compare the change rate with the preset value, in the case that the change rate is greater than the preset value, the historical full charge level is taken as the actual full charge level; In the case that the change rate is smaller than the preset value, the currently calculated full charge level is taken as the actual full charge level.

During the specific implementation, in the case that FCC1=40 wh, FCC0=38 wh, T1=25 degree and T2=20 degree, the change rate is 0.4 through the calculating and the preset value is 1, the change rate is smaller than the preset value, the currently calculated full charge level of 40 wh is taken as the actual full charge level.

In the embodiment of the present application, after the step of acquiring the actual full charge level of the battery on the basis of the at least one first battery state message, the at least one second battery state message at least and the charge level or discharge capacity, the method also comprises:

acquiring the first discharge capacity of the battery, wherein the first discharge capacity is the capacity discharged by the battery during the period from the full charge state to the current moment;

acquiring the current actual remaining power of the battery at the current moment and the percentage of the current actual remaining power of the battery on the basis of the actual full charge level and the first discharge capacity.

During the specific implementation, once obtained the actual full charge level, it is also required to obtain the first discharge capacity of the battery to adjust the percentage of the remaining power of the battery, in the embodiment of the present application, the first discharge capacity is the capacity discharged by the battery during the period from the full charge state to the current moment, such as: in the case that the capacity discharged from 100% to 65% of the battery, the specific first discharge capacity DC=26.6 wh, at that time, if the historical full charge level FCC0=38 wh is adopted for calculating, the percentage of the remaining power of the battery is 30%.

In the embodiment of the present application, as the calibration of the full charge level is completed and the updated actual full charge level after calibrating is 40 wh, therefore, the percentage of the current actual remaining power of the battery is (40 wh−26.6 wh)/40 wh=34%, therefore, the percentage of the remaining power of the battery should be adjusted into 34%.

In the embodiment of the present application, as the full charge level of the battery is calibrated and the percentage of the remaining power of the battery is calibrated and adjusted subsequently, thereby, a percentage of the remaining power with high accuracy can be presented to the user, enabling the user to perform reasonable operations on the electronic device according to the actual percentage of the remaining power, avoiding the inconvenience brought by the sudden shutdown during the use due to the inaccurate percentage of the remaining power presented by the electronic device; therefore, the technical solution in the embodiment of the present application brings a comparatively better experience to users.

Embodiment 2

Figure 4:
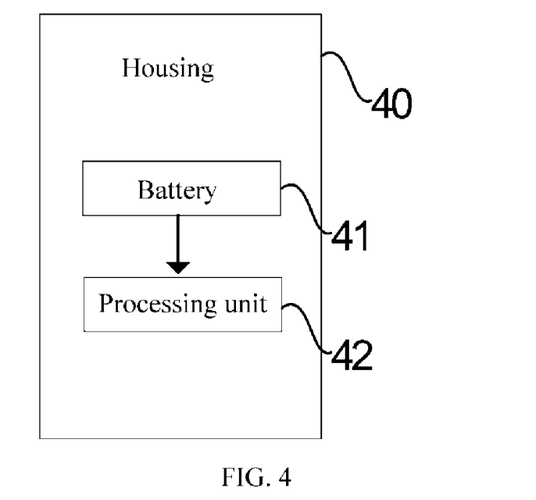
FIG. 4 is a structural view of an electronic device according to embodiment 2 of the present application.

Please refer to FIG. 4, wherein an embodiment of the present application also provides an electronic device, comprising:

housing 40;

battery 41, which is set in the housing 40;

processing unit 42 set in the housing 40, connecting with the battery 41, used for acquiring the at least one first battery state message when the battery of the electronic device is in the first dormant state; acquiring at least one second battery state message of the battery in a second dormant state and the charge level or discharge capacity of the battery during the first dormant state and the second dormant state when it is confirmed that the battery enters the non-dormant state from the first dormant state, and enters the second dormant state from the non-dormant state, wherein, when the battery is in the first dormant state and the second dormant state, both the charging current and discharging current of the battery are zero; and the actual full charge level of the battery can be calculated based on the at least one first battery state message, the at least one second battery state message and the charge level or discharge capacity.

Optionally, the processing unit 42 is used for:

acquiring the historical power consumption data of the battery;

acquiring the first current remaining power when the battery of the electronic device is in the first dormant state and acquiring the first cell temperature of the cell for the battery;

Accordingly, the processing unit 42 is used for:

acquiring the second current remaining power when the battery is in the second dormant state and acquiring the second cell temperature of the cell.

Optionally, the processing unit 42 is used for:

acquiring the current remaining power of the battery before the step of acquiring the second current remaining power when the battery is in the second dormant state and the step of acquiring the second cell temperature of the cell;

In the case that the current remaining power lies within the preset range, execute the step of: acquiring the second current remaining power and the second cell temperature of the cell when the battery is in the second dormant state.

Optionally, the processing unit 42 is used for:

acquiring the currently calculated full charge level of the battery on the basis of the first current remaining power, the second current remaining power and the charge level or discharge capacity, wherein, the currently calculated full charge level is the full charge level of the battery calculated currently;

acquiring the actual full charge level of the battery on the basis of the historical power consumption data, the currently calculated full charge level, the first cell temperature and the second cell temperature.

Optionally, the processing unit 42 is used for:

on the basis of the historical full charge level, the currently calculated full charge level, the first cell temperature and the second cell temperature, the change rate of the full charge level is acquired, wherein, the change rate is the ratio of the difference between the historical full charge level and the currently calculated full charge level to the difference between the first cell temperature and the second cell temperature;

In the case that the change rate is greater than a preset value, the historical full charge level is then adopted as the actual full charge level;

In the case that the change rate is smaller than the preset value, the currently calculated full charge level is then adopted as the actual full charge level.

Optionally, the processing unit 42 is used for:

acquiring the first discharge capacity of the battery after the step of acquiring the actual full charge level of the battery based on the at least one first battery state message, the at least one second battery state message and the charge level or discharge capacity, wherein, the first discharge capacity is the capacity discharged by the battery during the period from the full charge state to the current moment;

acquiring the current actual remaining power of the battery at the current moment and the percentage of the current actual remaining power of the battery on the basis of the actual full charge level and the first discharge capacity.

Through one or more technical solutions in the embodiment of the present application, one or more technical effects below can be realized:

As the technical solution in the embodiment of the present application is acquiring at least one first battery state message when the battery of the electronic device is in the first dormant state; acquiring at least one second battery state message of the battery in a second dormant state and the charge level or discharge capacity of the battery during the first dormant state and the second dormant state when it is confirmed that the battery enters the non-dormant state from the first dormant state, and enters the second dormant state from the non-dormant state, wherein, when the battery is in the first dormant state and the second dormant state, both the charging current and discharging current of the battery are zero; and the actual full charge level of the battery can be calculated based on the at least one first battery state message, the at least one second battery state message and the charge level or discharge capacity. So unlike in prior art, in which, in the case of calibrating the battery capacity, the battery should be fully charged firstly and then discharged from 100% to 1% while recording the real electricity quantity discharged to amend the reported capacity, in this technical solution, the actual full charge level of the battery can be obtained by calculating on the basis of the state messages obtained between the two dormant states of the battery of the electronic device and the charge level or discharge capacity between the two dormant states, without getting the battery fully charged in advance, thereby solving the technical problem that the calibration of battery capacity can only be conducted in a full charged state for the battery existing in the electronic device in prior art, achieving the technical effect of realizing the calibration of battery capacity even in the battery in a non-fully charged state.

As the technical solution in the embodiment of the present application is acquiring the current remaining power of the battery, in the case that the current remaining power lies within the preset range, execute the step of: acquiring the second current remaining power when the battery is in the second dormant state and acquiring the second cell temperature of the cell. In this technical solution, before acquiring the second current remaining power in the second dormant state, it is required to judge whether the obtained current remaining power value lies within the preset range and acquiring the second current remaining power in the case that only it lies within the preset range, thereby ensuring the accuracy for the calibration of battery capacity, thus achieving the technical effect of the accuracy for the calibration of battery capacity.

As the technical solution in the embodiment of the present application is acquiring the first discharge capacity of the battery, wherein, the first discharge capacity is the capacity discharged by the battery during the period from the full charge state to the current moment; acquiring the current actual remaining power of the battery at the current moment and the percentage of the current actual remaining power of the battery on the basis of the actual full charge level and the first discharge capacity. In this technical solution, after acquiring the actual full charge level, the percentage of actual remaining power should be determined on the basis of the obtained actual full charge level and the first discharge capacity, thereby providing an accurate percentage of the remaining power for the users of the electronic device, thus achieving the technical effect of an improved user experience.

As the technical solution provided in the embodiment of the present application is acquiring at least one first battery state message when the battery of the electronic device is in the first dormant state; acquiring at least one second battery state message of the battery in a second dormant state and the charge level or discharge capacity of the battery during the first dormant state and the second dormant state when it is confirmed that the battery enters the non-dormant state from the first dormant state, and enters the second dormant state from the non-dormant state, wherein, when the battery is in the first dormant state and the second dormant state, both the charging current and discharging current of the battery are zero; and the actual full charge level of the battery can be calculated based on the at least one first battery state message, the at least one second battery state message and the charge level or discharge capacity. So unlike in prior art, in which, in the case of calibrating the battery capacity, manual completion by the users is required, in this technical solution, with the state parameters obtained during two dormant states of the battery and the charge level or discharge capacity of the battery between the two dormant states, the battery capacity is calibrated automatically by the battery management unit, and during the calibrating of the battery capacity, the use of the electronic device for the user will not be affected, thus achieving the technical effect of an improved user experience.

As those skilled in the art will appreciate, the embodiments of the present invention can be provided in forms of methods, systems or computer program products. Therefore, forms of full hardware embodiment, full software embodiment or a combination of software and hardware can be adopted as the form of embodiment for the present invention. And the form of a computer program product which can be implemented on the one or more computer storage media (including but not limited to disk storage, CD-ROM, optical storage, etc.), which comprise the available program code for the computer, can be adopted for the present invention.

The present invention is described with reference to flow-charts and/or block-charts of methods, devices (systems) and computer program products on the basis of the embodiment of the present invention. It should be understood that the combination of each process of the flow-charts and/or the block-charts and/or the process of the flow-charts and/or the block-charts and/or the block can be realized with the computer program instructions. These computer program instructions can be provided to general purpose computer, special purpose computer, embedded processor or the processor of other programmable data processing device to produce a machine, enabling the instructions performed by the processor of computer or other programmable data processing device to produce the device which realizes the specified function in one or more processes in the flow-charts and/or in one or more blocks in the block-charts.

These computer program instructions can also be stored on the computer readable storage which guides the operation of computer or other programmable data processing device in a specified way, enabling the instructions stored in the readable storage of the computer to produce the manufacture which comprises the instruction device, the instruction device realizes the specified function in one or more processes in the flow-charts and/or in one or more blocks in the block-charts.

These computer program instructions can also be loaded to the computer or other programmable data processing device, performing a series of operation steps on the computer or other programmable data processing device to produce the process realized by the computer, thereby the instructions performed on the computer or other programmable data processing device provide the steps used for realizing the specified function in one or more processes in the flow-charts and/or in one or more blocks in the block-charts.

Specifically, the corresponding computer program instructions for the information processing method in the embodiment of the present application can be stored on storage media such as CD, hard disk and USB flash disk, once the corresponding computer program instructions in the storage media for the information method being read or performed by an electronic device, the following steps comprising:

acquiring at least one first battery state message when the battery of the electronic device is in the first dormant state;

acquiring at least one second battery state message of the battery in a second dormant state and the charge level or discharge capacity of the battery during the first dormant state and the second dormant state when it is confirmed that the battery enters the non-dormant state from the first dormant state, and enters the second dormant state from the non-dormant state, wherein, when the battery is in the first dormant state and the second dormant state, both the charging current and discharging current of the battery are zero, and the actual full charge level of the battery can be calculated on the basis of at least one first battery state message, at least one second battery state message and the charge level or discharge capacity.

Optionally, acquiring the historical power consumption data of the battery;

The storage steps according to the storage media: the step of acquiring at least one first battery state message when the battery of the electronic device is in the first dormant state, during the specific performing of the corresponding computer instructions, the following steps are comprised:

acquiring the first current remaining power when the battery of the electronic device is in the first dormant state and acquiring the first cell temperature of the cell for the battery;

The storage steps according to the storage media: the step of acquiring at least one second battery state message when the battery is in the second dormant state, during the specific performing of the corresponding computer instructions, comprising:

acquiring the second current remaining power when the battery is in the second dormant state and acquiring the second cell temperature of the cell.

Optionally, other computer instructions are also stored in the storage media, the other computer instructions are performed before the performing of corresponding computer instructions for the steps of: the step of acquiring the second current remaining power when the battery is in the second dormant state and the step of acquiring the second cell temperature of the cell, the preforming processes comprise the following steps of:

acquiring the current remaining power of the battery;

In the case that the current remaining power lies within the preset range, execute the step of: acquiring the second current remaining power and the second cell temperature of the cell when the battery is in the second dormant state.

Optionally, other computer instructions are also stored in the storage media, the other computer instructions are performed after the performing of corresponding computer instructions for the steps of: the step of acquiring one second battery state message of the battery at least in the second dormant state and the charge level or discharge capacity of the battery during the first dormant state and the second dormant state, the preforming processes comprise the following steps of:

acquiring the currently calculated full charge level of the battery on the basis of the first current remaining power, the second current remaining power and the charge level or discharge capacity, wherein, the currently calculated full charge level is the full charge level of the battery calculated currently;

acquiring the actual full charge level on the basis of the historical power consumption data, the currently calculated full charge level, the first cell temperature and the second cell temperature.

Optionally, the stored in the storage media and the steps: in the case that the historical power consumption data is the historical full charge level, the step of acquiring the actual full charge level on the basis of the historical power consumption data, the currently calculated full charge level, the first cell temperature and the second cell temperature, during the performing of the corresponding computer instructions, comprising:

on the basis of the historical full charge level, the currently calculated full charge level, the first cell temperature and the second cell temperature, the change rate of the full charge level is acquired, wherein, the change rate is the ratio of the difference between the historical full charge level and the currently calculated full charge level to the difference between the first cell temperature and the second cell temperature;

In the case that the change rate is greater than a preset value, the historical full charge level is then adopted as the actual full charge level;

In the case that the change rate is smaller than the preset value, the currently calculated full charge level is then adopted as the actual full charge level.

Optionally, other computer instructions are also stored in the storage media, the other computer instructions are performed after the performing of corresponding computer instructions for the step of acquiring the actual full charge level on the basis of the historical power consumption data, the currently calculated full charge level, the first cell temperature and the second cell temperature, the preforming processes comprise the following steps of:

acquiring the first discharge capacity of the battery, wherein the first discharge capacity is the capacity discharged by the battery during the period from the full charge state to the current moment;

acquiring the current actual remaining power of the battery at the current moment and the percentage of the current actual remaining power of the battery on the basis of the actual full charge level and the first discharge capacity.

Although described the preferred embodiment of the present invention, however, once the basic creative concept is known to those skilled in the art, it is possible to make changes and modifications on these embodiments. Therefore, the appended claims intend to be explained as which comprising the preferred embodiment and all changes and modifications lying within the scope of the present invention.

Obviously, those skilled in the art can make various alterations and deformations to the present invention without departing from the spirit and scope of the present invention. In this way, in the case that these alterations and deformations of the present invention belong to the scope of the claims of the present invention or its equal technologies, the present invention also intend to comprise these alterations and deformations.

What is claimed is:

1. A computer-implemented method, comprising executing on a processor the steps of:
    determining at least one first battery state of a battery of an electronic device while the battery is in a first dormant state wherein a charging current level and a discharging current level of the battery are zero, wherein the at least one first battery state is a non-fully charged state;
    in response to the battery entering a non-dormant state from the first dormant state, and to the battery entering a second dormant state from the non-dormant state wherein the charging current level and the discharging current level of the battery are zero, determining at least one second battery state of the battery while the battery is in the second dormant state, and at least one of a charge level or discharge capacity of the battery during the first dormant state and the second dormant state; and
    determining an actual full charge level of the battery as a function of the at least one first battery state, the at least one second battery state and the determined at least one of the charge level and the discharge capacity of the battery during the first dormant state and the second dormant state.

2. The method according to claim 1, further comprising:
    determining a historical power consumption data of the battery; and
    wherein the step of determining the at least one first battery state comprises determining, while the battery of the electronic device is in the first dormant state, a first current remaining power level and a first cell temperature of a cell of the battery; and
    wherein the step of determining the at least one second battery state comprises determining, while the battery of the electronic device is in the second dormant state, a second current remaining power level and a second cell temperature of the battery cell.

3. The method according to claim 2, further comprising:
    before the step of determining the second current remaining power level and the second cell temperature, determining a current remaining power of the battery; and
    wherein the step of determining, while the battery of the electronic device is in the second dormant state, the second current remaining power level and the second cell temperature of the battery cell, is in response to determining that the current remaining power lies within a preset range.

4. The method according to claim 3, further comprising:
    subsequent to determining the at least one second battery state when the battery is in the second dormant state and the at least one of the charge level and the discharge capacity of the battery during the first dormant state and the second dormant state, determining a current calculated full charge level of the battery as a function of the first current remaining power, the second remaining power and the at least one of the charge level and the discharge capacity of the battery during the first dormant state and the second dormant state.

5. The method according to claim 4, further comprising:
    determining an actual full charge level of the battery as a function of the historical power consumption data, the currently calculated full charge level, the first cell temperature and the second cell temperature.

6. The method according to claim 5, wherein the historical power consumption data is a historical full charge level, the method further comprising the steps of:
    determining a change rate of the full charge level as a ratio of a difference between the historical full charge level and the currently calculated full charge level to a difference between the first cell temperature and the second cell temperature;
    in response to determining that the change rate is greater than a preset value, adopting the historical full charge level as the actual full charge level; and
    in response to determining that the change rate is smaller than the preset value, adopting the currently calculated full charge level as the actual full charge level.

7. The method according to claim 1, further comprising:
    determining the discharge capacity of the battery during one of the first and the second dormant states as an amount of capacity discharged by the battery from a full charge state to a charge state at a current moment in time; and
    determining an amount of actual remaining power of the battery at the current moment in time and a percentage of the current actual remaining power of the battery as a function of the actual full charge level and the first discharge capacity.

8. An electronic device, comprising:
    a housing;
    a battery disposed in the housing; and
    a processing unit disposed in the housing and connected with the battery;
    wherein the processing unit:
    determines at least one first battery state of the battery while the battery is in a first dormant state wherein a charging current level and a discharging current level of the battery are zero, wherein the at least one first battery state is a non-fully charged state;
    in response to the battery entering a non-dormant state from the first dormant state, and to the battery entering a second dormant state from the non-dormant state wherein the charging current level and the discharging current level of the battery are zero, determines at least one second battery state of the battery while the battery is in the second dormant state, and at least one of a charge level or discharge capacity of the battery during the first dormant state and the second dormant state; and
    determines an actual full charge level of the battery as a function of the at least one first battery state, the at least one second battery state and the determined at least one of the charge level and the discharge capacity of the battery during the first dormant state and the second dormant state.

9. The electronic device of claim 8, wherein the processing unit:
    determines a historical power consumption data of the battery;
    determines the at least one first battery state by determining, while the battery of the electronic device is in the first dormant state, a first current remaining power level and a first cell temperature of a cell of the battery; and
    determines the at least one second battery state by determining, while the battery of the electronic device is in the second dormant state, a second current remaining power level and a second cell temperature of the battery cell.

10. The electronic device of claim 9, wherein the processing unit:
determines a current remaining power of the battery before determining the second current remaining power level and the second cell temperature; and
determines, while the battery of the electronic device is in the second dormant state, the second current remaining power level and the second cell temperature of the battery cell, in response to determining that the current remaining power lies within a preset range.

11. The electronic device of claim 10, wherein the processing unit:
subsequent to determining the at least one second battery state when the battery is in the second dormant state and the at least one of the charge level and the discharge capacity of the battery during the first dormant state and the second dormant state, determining a current calculated full charge level of the battery as a function of the first current remaining power, the second current remaining power and the at least one of the charge level and the discharge capacity of the battery during the first dormant state and the second dormant state.

12. The electronic device of claim 11, wherein the processing unit:
determines an actual full charge level of the battery as a function of the historical power consumption data, the currently calculated full charge level, the first cell temperature and the second cell temperature.

13. The electronic device of claim 12, wherein the historical power consumption data is a historical full charge level, and wherein the processing unit:
determines a change rate of the full charge level as a ratio of a difference between the historical full charge level and the currently calculated full charge level to a difference between the first cell temperature and the second cell temperature;
in response to determining that the change rate is greater than a preset value, adopts the historical full charge level as the actual full charge level; and
in response to determining that the change rate is smaller than the preset value, adopts the currently calculated full charge level as the actual full charge level.

14. The electronic device according to claim 8, wherein the processing unit:
determines the discharge capacity of the battery during one of the first and the second dormant states as an amount of capacity discharged by the battery from a full charge state to a charge state at a current moment in time; and
determines an amount of actual remaining power of the battery at the current moment in time and a percentage of the current actual remaining power of the battery as a function of the actual full charge level and the first discharge capacity.

15. A computer program product, comprising:
a non-transitory computer storage media comprising program code instructions thereon for execution by a processing unit that is in communication with a battery that cause the processing unit to:
determine at least one first battery state of the battery while the battery is in a first dormant state wherein a charging current level and a discharging current level of the battery are zero, wherein the at least one first battery state is a non-fully charged state;
in response to the battery entering a non-dormant state from the first dormant state, and to the battery entering a second dormant state from the non-dormant state wherein the charging current level and the discharging current level of the battery are zero, determine at least one second battery state of the battery while the battery is in the second dormant state, and at least one of a charge level or discharge capacity of the battery during the first dormant state and the second dormant state; and
determine an actual full charge level of the battery as a function of the at least one first battery state, the at least one second battery state and the determined at least one of the charge level and the discharge capacity of the battery during the first dormant state and the second dormant state.

16. The computer program product of claim 15, wherein the program code instructions for execution by the processing unit further cause the processing unit to:
determine a historical power consumption data of the battery;
determine the at least one first battery state by determining, while the battery of the electronic device is in the first dormant state, a first current remaining power level and a first cell temperature of a cell of the battery; and
determine the at least one second battery state by determining, while the battery of the electronic device is in the second dormant state, a second current remaining power level and a second cell temperature of the battery cell.

17. The computer program product of claim 16, wherein the program code instructions for execution by the processing unit further cause the processing unit to:
determine a current remaining power of the battery before determining the second current remaining power level and the second cell temperature; and
determine, while the battery of the electronic device is in the second dormant state, the second current remaining power level and the second cell temperature of the battery cell, in response to determining that the current remaining power lies within a preset range.

18. The computer program product of claim 17, wherein the program code instructions for execution by the processing unit further cause the processing unit to:
subsequent to determining the at least one second battery state when the battery is in the second dormant state and the at least one of the charge level and the discharge capacity of the battery during the first dormant state and the second dormant state, determine a current calculated full charge level of the battery as a function of the first current remaining power, the second current remaining power and the at least one of the charge level and the discharge capacity of the battery during the first dormant state and the second dormant state; and
determine an actual full charge level of the battery as a function of the historical power consumption data, the currently calculated full charge level, the first cell temperature and the second cell temperature.

19. The computer program product of claim 18, wherein the historical power consumption data is a historical full charge level, and wherein the program code instructions for execution by the processing unit further cause the processing unit to:
determine a change rate of the full charge level as a ratio of a difference between the historical full charge level and the currently calculated full charge level to a difference between the first cell temperature and the second cell temperature;

in response to determining that the change rate is greater than a preset value, adopt the historical full charge level as the actual full charge level; and in response to determining that the change rate is smaller than the preset value, adopt the currently calculated full charge level as the actual full charge level.

20. The computer program product of claim 16, wherein the program code instructions for execution by the processing unit further cause the processing unit to:

determine the discharge capacity of the battery during one of the first and the second dormant states as an amount of capacity discharged by the battery from a full charge state to a charge state at a current moment in time; and determine an amount of actual remaining power of the battery at the current moment in time and a percentage of the current actual remaining power of the battery as a function of the actual full charge level and the first discharge capacity.

* * * * *